March 15, 1966 A. J. CERTA ETAL 3,240,630

METHOD FOR FABRICATING A RECTIFYING CONNECTION TO A BODY OF N-TYPE GERMANIUM, SOLDER FOR FORMING A RECTIFYING CONNECTION IN A BODY OF N-TYPE GERMANIUM, AND SEMICONDUCTOR DEVICE COMPRISING A RECTIFYING CONNECTION TO A BODY OF N-TYPE GERMANIUM

Filed Sept. 4, 1962

INVENTORS
ANTHONY J. CERTA
ALFRED E. WATKINS
BY
Albert L. Free
ATTORNEY 3,240,630
Patented Mar. 15, 1966

3,240,630

METHOD FOR FABRICATING A RECTIFYING CONNECTION TO A BODY OF N-TYPE GERMANIUM, SOLDER FOR FORMING A RECTIFYING CONNECTION IN A BODY OF N-TYPE GERMANIUM, AND SEMICONDUCTOR DEVICE COMPRISING A RECTIFYING CONNECTION TO A BODY OF N-TYPE GERMANIUM

Anthony J. Certa, Norristown, and Alfred E. Watkins, North Wales, Pa., assignors to Philco Corporation, Philadelphia, Pa., a corporation of Delaware Filed Sept. 4, 1962, Ser. No. 221,293
11 Claims. (Cl. 148—1.5)

Figure 1:
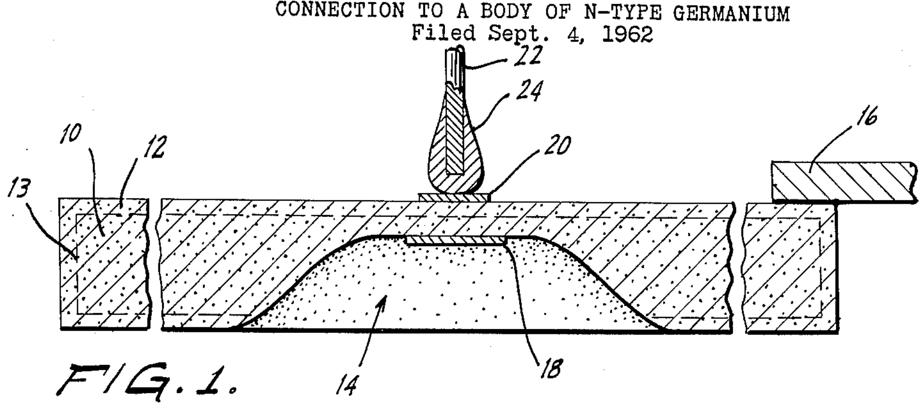

This invention relates to semiconductor devices of the type using rectifying, fused contacts to a semiconductive body, and especially to such devices in which contacts containing cadmium and/or zinc are fused to a body of N-type germanium to produce a rectifying junction suitable for use as the collector of a transistor. It also relates to methods for making such devices.

Semiconductor devices are known in the prior art which make use of a rectifying junction between a portion of a germanium body which is of N-type characteristics and a portion thereof which is of P-type characteristics formed by fusing a body of P-type activator material to a surface region of the N-type germanium body. Such fused connections are also known as alloy-junction connections, and are used widely in semiconductor diode and transistor devices. For example, in a transistor one such connection may be provided on one side of a thin wafer of N-type germanium to serve as the minority-carrier emitter while a similar, slightly larger, fused connection may be provided on the side of the wafer opposite the emitter connection to serve as the collector of the transistor. It is also known, as described and claimed in U.S. Patent No. 2,870,052 of A. D. Rittmann, issued January 20, 1959, to fuse such connections into the semiconductor to an extremely small depth, e.g., of the order of 0.001 mil or less, and to include in the dopant material an extremely strong activator substance such as gallium so that the alloyed region in the germanium, despite its extreme thinness, is characterized by extremely good rectifying characteristics and high efficiency as an emitter of minority carriers into the body. As described in said patent of Rittmann and as also described in the U.S. Patent No. 2,930,108 of R. A. Williams, issued March 29, 1960, the material which is fused to the germanium, and the time and temperature of heating of the material during fusion, may be selected so that a suitable filamentary whisker or rigid pin to be used as a lead member for the fused junction may be firmly soldered to the fused connection during the same alloying process which produces the junction. This is accomplished by merely contacting the lead member to the fused material while the material is still molten and until the molten material resolidifies. Application of this process and its resultant construction has led to the commercial production of important types of transistor devices characterized by excellent high-frequency amplifying capabilities.

In such forms of transistor devices the fused contact is preferably formed by first coating a portion of the germanium body with a suitable metal and then soldering the lead to the body by applying the solder material to the previously-applied layer of metal while heating the solder and metal layer. The result is a fusion of the solder with the previously-applied metal layer and with a small portion of the germanium underlying the metal layer. Dissolution of the underlying germanium is limited by utilizing short times and low temperatures for the alloying process. Upon cooling, the molten mass resolidifies, and germanium containing some of the strong P-type activator substance recrystallizes upon the underlying solid germanium so that a very thin P-type region is formed on the N-type germanium with a P-N junction between the P-type region and the N-type body. In the forms of the structure and process specifically described in the above-mentioned patents of Rittmann and Williams, the metal layer is preferably of indium and the solder material is typically indium-gallium alloy.

In U.S. Patent No. 3,005,735 of George L. Schnable, filed July 24, 1959 and issued October 24, 1961 there is described a further improvement in such structures and methods in which the underlying metal is of cadmium and the solder is cadmium-gallium or cadmium-tin. The advantages of this device accrue from the higher melting points of the cadmium alloys used, which permit operation of the final device at higher power levels and also permit baking of the unit at higher temperatures so that the stability and reliability of the device are improved.

In devices of the general type described above, including those utilizing indium, cadmium or zinc as the originally-applied metal layer, one percent or so by weight of gallium is preferably included in the emitter connection, since it greatly enhances the minority-carrier injecting capabilities of the connection. While in some devices gallium may also be utilized in the collector connection, in many types of devices no gallium is utilized in the collector connection. This is because gallium is known to produce efficient minority-carrier injection, and in certain types of devices such injection from the collector connection is highly undesirable.

For example, in certain so-called "switching" transistors, which are designed for use in pulse circuits such as computer circuits, the transistor is used as a switch controllable between its ON and OFF states by the alternate application of two different levels of base-to-emitter voltage to produce strong collector current or substantially no collector current in the device, depending on which voltage level is applied. In such switching transistors it is often desirable to produce very strong conduction through the collector in the ON condition, and to accomplish this the base of the transistor is customarily driven so far in the ON direction that the collector connection, which is normally reverse biased with respect to the base, becomes forward-biased with respect to the base. This condition is commonly referred to as the saturation condition of the transistor. In this saturation condition the collector is biased in the direction of easier current flow, and if the collector is a good injector of minority carriers a large number of such carriers will be produced in the base during saturation. When at a later time it is desired to return the transistor rapidly to its OFF condition, the base is rapidly switched to its cut-off voltage level. However, the collector current does not instantaneously disappear because it requires a definite time, commonly termed the "clean-up" time, for the collector current to remove the minority carriers injected by the collector and stored in the base body during the saturation interval. Such failure of the collector current to terminate immediately upon occurrence of the OFF voltage at the input of the transistor undesirably limits the speed at which switching can be produced by the device.

A convenient factor for indicating the magnitude of the "clean-up" time during which collector current persists at substantially its ON value, even though the base circuit has been switched to its OFF condition, is the parameter $K'_s$ expressed in nanoseconds. The significance of this parameter and methods for its measurements are described fully in an article entitled "Hole Storage Delay Time and Its Prediction" by C. D. Simmons beginning at page 14 of the magazine "Semiconductor Products" for May/June of 1958. "Clean-up" time is proportional to the parameter $K'_s$ and also depends on the base current flowing in the device before and after turn-off of the transistor.

Accordingly, in transistors intended for high-speed switching applications it has been common to design the collector connection so that it is as poor an injector of minority carriers as possible, while still exhibiting satisfactory rectifier characteristics. For example, in the above-mentioned indium fused-contact transistor of the type employing extremely shallow alloying, it has been common to utilize gallium along with the indium as the impurity metal for producing the emitter connection of the transistor, while using no gallium in forming the collector connection. This makes the emitter an excellent injector of minority carriers, but reduces greatly the minority-carrier injection capablities of the collector.

However, it has been found that when high-temperature contact materials such as cadmium or zinc are used in place of indium in the collector connection in order to improve the reliability and high-temperature performance of the transistor, the expedient of merely using no gallium in the collector creates certain additional problems. In particular, if the impurity metal of the fused collector contact is heated sufficiently during alloying to produce a satisfactorily strong and stable mechanical and electrical solder bond to the lead member to be attached thereto, then the rectifying characteristics of the collector junction deteriorate substantially, particularly with regard to the reverse-leakage current of the collector junction, the voltage at which reverse-breakdown occurs, and the long-term stability of the desired electrical characteristics. It will be understood that while some of the transistors so made do not necessarily deteriorate appreciably from this cause, the percentage of the transistors which are satisfactory, i.e., the yield, is greatly reduced. On the other hand, when the amount of heating of the collector connection during alloying is reduced sufficiently to avoid such degradation of the rectifying characteristics of the collector, then the percentage of transistors having faulty collector-lead attachment is greatly increased. In many cases it is only by an extremely critical adjustment of the amount of heating employed during alloying that any substantial yield of satisfactory transistors can be obtained.

Another problem existing in such collector connections of the type using zinc or cadmium materials alloyed to an extremely small depth into germanium is that the above-mentioned minority-carrier "clean-up" time, while low compared to that which would be obtained if gallium in the prior-art amounts had been added to the collector impurity materials, is still higher than is desirable for some applications. Thus as the demand for faster and faster switching has increased, the necessity has arisen for decreasing the "clean-up" time as much as possible.

Accordingly it is an object of our invention to provide on a body of germanium a new and improved fused, rectifying, connection of the class which contains cadmium or zinc in the fused impurity material, and to provide a method for making such a connection.

Another object is to provide such a fused connection having shorter "clean-up" times than previously known forms of such structures, as well as a method for making such improved connections.

It is also an object to provide a fused-contact structure of the type employing zinc or cadmium fused with germanium, and a metal lead member soldered to the fused contact, in which structure the mechanical connection of the lead member to the fused material is improved, excellent rectifying characteristics are obtained, and the "clean-up" time is short.

It is a further object to provide a new and improved transistor of the type utilizing a fused contact for the collector connection.

Still another object is to provide such a transistor in which the fused contact contains zinc or cadmium and in which the rectifying characteristics, the "clean-up" time and the electrical and mechanical stability of attachment of a lead member thereto are enhanced.

In accordance with the invention the above objects are achieved by providing on an N-type germanium body a fused connection containing zinc or cadmium and a trace of gallium. In a preferred form of the invention the fused contact is made by applying to the surface of the body of N-type germanium a surface layer of zinc or cadmium and then applying to this layer a solder material containing about 0.01% to 0.04% of gallium. The solder containing the trace of gallium and the layer of cadmium or zinc are then heated to form a common melt with a small portion of the underlying germanium, after which the melt is resolidified to form a rectifying connection to the germanium body. Preferably the metallic lead member is held in contact with the melt during the resolidification so that after cooling the lead member is mechanically and electrically bonded to the fused connection. A particularly advantageous solder for this purpose comprises tin-zinc-gallium, in the approximate proportions of 90% tin to 10% zinc, the gallium comprising about 0.01% to 0.04% by weight.

Using this trace amount of gallium, we have found that much more heating of the impurity material during alloying may be provided without degrading the rectifying characteristics of the final fused junction, and since more heating can be utilized, the mechanical and electrical connection of the lead member to the fused contact is greatly improved. At the same time, despite the fact that in the prior-art the addition of gallium was utilized to increase the hole-injecting capabilities of the contact, we have found that by using trace amounts of gallium in the ranges indicated above, the hole-storage and "clean-up" time are not materially increased, and with added amounts of gallium near the lower end of the above-mentioned range the addition of the gallium actually decreases the hole-storage. Accordingly, by our invention the yields of transistors using such fused contacts as collector connections are greatly increased because of improvements in the rectifying characteristics of the collector junction and in the electrical and mechanical bonding of the lead member soldered thereto, while at the same time the hole storage and "clean-up" time are kept low or actually reduced.

Figure 2:
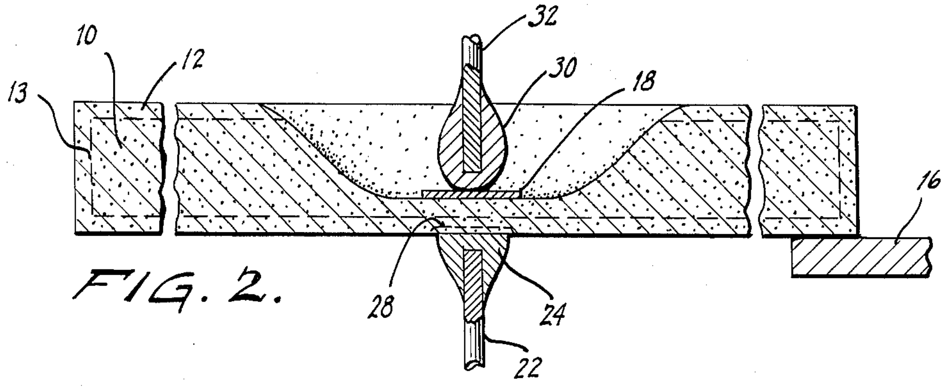
Figure 3:
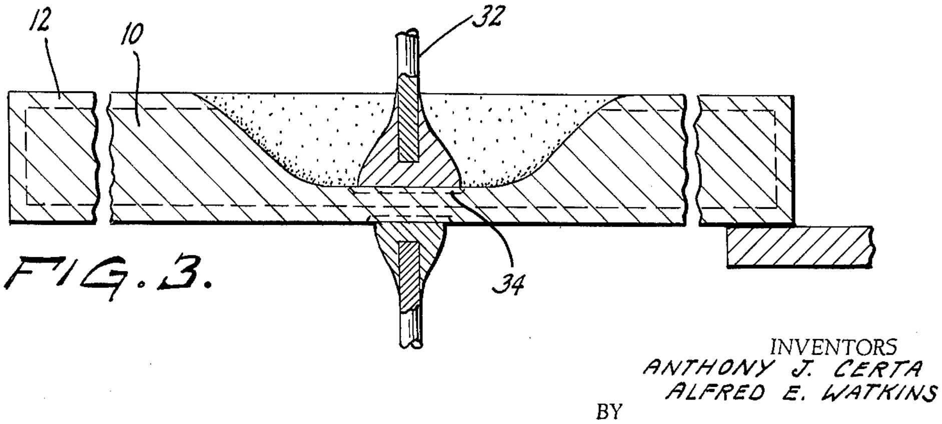

Other objects and features of the invention will be more fully appreciated from a consideration of the following detailed description taken in connection with the accompanying drawings, in which:

FIGURES 1, 2 and 3 are sectional views illustrating a transistor in successive stages of fabrication in accordance with a preferred embodiment of the invention.

Referring now specifically to the preferred embodiment of the invention illustrated in FIGURES 1–3, in which corresponding numerals indicate corresponding parts and in which the various parts are not necessarily to scale, the invention will first be described, by way of example only, with reference to its application in the construction of a high-frequency transistor of the type utilizing an N-type germanium base wafer having two P-type regions in opposite sides thereof formed by fusing P-type impurity metals into opposite surfaces of the wafer to an extremely small distance, and in which the germanium base is of the non-homogeneous type. That is, the base is of high resistivity adjacent the collector connection and of much lower resistivity adjacent the emitter connection. This general type of transistor is now well known in the art and is illustrated and described for example in the above mentioned patent of Schnable, particularly with relation to FIGURE 4 thereof.

FIGURE 1 illustrates this device prior to formation of the fused emitter and collector connections. It comprises a wafer 10 of germanium the bulk of which is of high resistivity, for example, 20 to 30 ohm-centimeter, and which has a thin surface skin 12, delimited by the dashed line 13, of a much lower, and graded, resistivity. Typically this skin is formed by the diffusion into all the surfaces of the wafer of an N-type dopant such as phosphorus or arsenic, so that the skin is so highly conductive at its exterior surface as to exhibit nearly metallic conduction characteristics, but has a progressively higher resistivity proceeding into the interior of the wafer, until at the position indicated by dashed-line 13 it substantially reaches the bulk resistivity of 30 or 40 ohm-centimeters. A circular pit is formed in the underside of wafer 10, as by jet-electrolytic etching, so that the thickness of the wafer is reduced to the order of a few tenths of a mil near the bottom of the pit. In the present case the thickness of the strongly N-type skin 12 is of the order of a few hundredths of a mil and accordingly the bottom of the pit 14 lies in the portion of the wafer having high resistivity. A small amount of germanium is preferably removed from the surface of the wafer opposite the bottom of the pit 14, as by jet-electrolytic etching, to remove the substantially-metallic outer surface of the germanium and expose a region which, while of very low resistivity, is still semiconductive. Typically this material will have a resistivity of the order of 0.01 to 0.001 ohm-centimeter, and the amount of material which is removed to expose this region is so slight that it is not shown in the drawing.

A conventional metal base tab 16, as of nickel, is ohmically affixed by conventional soldering to a peripheral portion of the top surface of wafer 10. A thin metal layer 18 is applied to the bottom of pit 14 as by jet-electrolytic plating to a thickness of a few tenths of a mil or less. This layer of metal may be circular in shape, and a similar circular metal layer 20 concentric with layer 18 is similarly applied on the opposite surface of the wafer. A lead member 22 such as a filament of silver wire is provided at its end with a globule of solder material 24. In the form of the device here described the metal layers 18 and 20 are of cadmium or zinc, and the solder globule 24 may be of 89% tin, 10% zinc and about 1% gallium by weight. Heat is then applied to the solder to cause it to melt and to form a common molten mass with the underlying metal layer 20 and with a thin stratum of the skin 12 in the underlying germanium. Typically the depth of alloying into the germanium is less than about 0.001 mil. The heating may be applied in any of a variety of ways. One suitable way is to apply a pair of opposed jaws to a portion of lead member 22, with an electrical voltage applied between the jaws, so that a current passes across lead 22 to produce heat therein which flows down the lead member to the solder. Alternatively a hot coil may be placed momentarily near the solder. Heating times are typically very short, e.g., of the order of a few tenths of a second to several seconds. The molten mass is then cooled to form the fused connection and to solder the lead member 22 to the connection.

The resultant fused emitter connection is shown in FIGURE 2, in which figure the transistor wafer 10 has been turned upsidedown so that the emitter is on the lower side of the wafer. As shown, the resolidified metal consisting principally of the original solder material is fused to the wafer 10 over an area equal to that defined by the original metal layer 20, and a rectifying P-N junction 28 is formed in the germanium immediately beneath the metal.

The device and process thus far described in detail with respect to FIGURES 1 and 2 are in accordance with prior-art techniques for making the base and emitter connections of cadmium-plated fused-contact transistors. The present invention is embodied in the fabrication of the collector connection, especially in the nature of the material used for the solder globule 30 which is to be used to form the collector connection of the transistor and to fasten thereto the collector lead 32, which may be of silver. In accordance with the invention the solder globule 30 formed as collector lead 32 contains between about 0.01% and 0.04% of gallium by weight, 0.03% being preferred. In the present example the main bulk of the solder comprises about 90% tin and 10% zinc. As in the formation of the emitter connection, the collector solder 30 is melted momentarily by the application of heat and produces a common melt with the cadmium layer 18 and with a very thin portion of the underlying N-type germanium of the body 10, which melt resolidifies shortly after the heating is discontinued. Typical heating is to about 300° C. for a few tenths to several seconds. The optimum amount of heating is preferably determined by routine experimentation, varying the time and temperature of heating to obtain the best results. Too little heating produces poor mechanical and electrical bonds with wire 32, while excessive heating tends to degrade the collector diode.

FIGURE 3 shows the functionally-complete transistor which differs from that shown in FIGURE 2 in that the solder body 30 has fused with cadmium electrode 18 and with a small portion of the underlying germanium and, after cooling, has produced soldering of lead 32 to the germanium and has formed the collector P–N junction 34 in the germanium immediately under the fused contact. The position of the periphery of the fused collector contact is substantially identical with that of the original cadmium layer 18.

The solder body 30 may be formed in any convenient manner, as by electroplating tin, zinc and gallium upon the end of lead member 32 in the desired proportions. While it is sometimes convenient to apply the solder by dipping the lead member into a solution of the desired solder constituents, especially in the case in which the lead is a substantial rod rather than a thin whisker, we prefer to utilize an electroplating process in the present embodiment.

In one specific case the solder globule 30 is formed as follows: A bath consisting of the following is formed:

| | Grams |
|---|---|
| Glycerine | 1600 |
| Anhydrous $SnCl_2$ | 352 |
| $ZnCl_2$ | 75 |
| $NH_4Cl$ | 160 |
| Dodecylbenzene sodium sulfonate | 0.6 |
| Anhydrous gallium ammonium chloride (approximately 60% $GaCl_3$ | 0.1 to 0.5 |

A silver wire 0.003″ in diameter is immersed at one end to a depth of 0.3 mil in the above solution while the solution is maintained at 155° C. and while a stream of nitrogen gas is caused to flow over the surface of the bath adjacent the wire. The wire is made 22 volts negative with respect to an anode of carbon in the bath for about 3.5 seconds, the plating current at the end of this time being about 30 microamperes. The voltage is then removed, the wire removed from the bath, and the plated globule of tin, zinc and gallium cooled to permit solidification. Next the globule (which is globule 30 of FIGURE 2) is abutted against the cadmium layer 18 as shown in FIGURE 2, a pair of opposed metal jaws are closed onto the wire 32 about 25 mils from the globule, and a current of about 50 amperes passed across the wire between the jaws for about 4 seconds. Upon cooling, the P-N junction 34 of FIGURE 3 is formed and the wire 32 is firmly soldered to the metallic connection. The transistor structure of FIGURE 3 is typically mounted on a transistor stem, given a preliminary bake at about 150° C., encapsulated in a hermetically-sealed container, and given a stabilizing bake for about 15 hours at 150° C.

As listed above, the gallium ammonium chloride in the globule-plating bath is from about 0.1 to 0.5 gram, corresponding to about 0.01% to 0.04% gallium by weight in the globule. The exact percentage of gallium used determines the exact characteristics obtained in the final device. Below about 0.01% gallium the device does not differ appreciably from the prior-art collector connection using a cadmium layer soldered with a tin-zinc alloy, and therefore if the heat applied during alloying is sufficient to provide an adequate solder bond to the lead wire then the reverse characteristic of the collector junction degrades by exhibiting a higher reverse saturation current $I_{co}$ at a given reverse voltage and a lower and more gradual reverse-voltage break-down. If in this case the heat is reduced to avoid such degradation, then the solder bond is mechanically and/or electrically inadequate. Above about 0.04% gallium the collector connection is substantially like that of the prior-art using 1% or so of gallium, in that the soldering and the rectifying characteristics are satisfactory but the hole storage factor $K'_s$ becomes very high, i.e. about 100 nanoseconds. Within the range of 0.01 to 0.04% of gallium, more heat can be used during alloying than with no gallium without degrading the rectifying characteristics. The permissible amount of heating increases with increasing gallium content, thus permitting better solder bonding; at the same time the hole storage factor $K'_s$, and hence the "clean-up" time which limits transistor switching time, is maintained small compared with that of a conventional gallium-doped connection. In fact, by using gallium percentages near the lower end of our range, i.e., below about 0.025%, the hole storage factor $K'_s$ is made even lower than when no gallium at all is used, resulting in faster switching rates than were previously obtainable.

For example, in a device made as described in detail hereinbefore with 0.01% of gallium in the collector connection, value of $K'_s$ of 15 to 25 nanoseconds were obtained as compared with 35 to 45 nanoseconds in a prior-art device differing only in that gallium was omitted altogether. In another embodiment of our device similar in form and construction to that described hereinbefore but differing in using 0.025% gallium by weight in the collector connection, the hole-storage factor $K'_s$ was 8 to 15 nanoseconds as compared with 20 to 30 nanoseconds for the same device with no gallium at all, and yet the heating employed during alloying was easily great enough to provide excellent lead soldering without introducing degradation of the rectifying characteristics of the collector connection.

In another form of the invention the layer 18 of cadmium is replaced with a layer of zinc, and again the use of a trace of gallium in the solder globule in the range of about 0.01% to 0.04% produces the above-described improvements in rectifying characteristics, soldering and hole-storage factor. In still another application of the invention the transistor was of the homogeneous-base type, and the solder was of tin-cadmium with 0.01% to 0.04%, and preferably about 0.025%, of gallium by weight, resulting in a one-half reduction of $K'_s$ as compared with the prior-art form of this transistor which used no gallium. The tin-cadmium-gallium solder has a lower melting point than the tin-zinc-gallium solder and hence is particularly useful in making the collector connection of a transistor which uses tin-zinc in the emitter connection, since the collector connection can then be alloyed at lower temperatures for which there is less danger of deleteriously affecting the previously-formed emitter connection. However, the tin-zinc-gallium solder is generally preferred to the tin-cadmium-gallium solder because it provides better fluxing action for soldering purposes.

The solder material need not be plated on the end of a whisker, but may for example be applied to the end of a rod-shaped lead member by dipping the end of the rod in the previously-prepared solder. In addition, while the invention is particularly advantageous in applications in which a lead member is soldered simultaneously with the forming of the alloy-junction, it is also useful in reducing $K'_s$, and hence the hole "clean-up" time, of an alloy-junction contact even when a lead member is not simultaneously soldered to the connection. It will also be understood that while in the foregoing example the trace of gallium is included in the solder material before melting, it may be introduced into the melt in other ways instead. For example it may be included in the lead member and dissolved therefrom by the molten solder, or added directly to the melt of solder and germanium in any convenient manner.

Furthermore, while it is preferred that a layer of zinc or cadmium be applied to the germanium before alloying, it is also possible to employ our method with no such layer or with a layer of another material which will dissolve during the alloying process.

While the invention has been described with particular reference to specific embodiments thereof, it will be understood that it may be embodied in many other device forms without departing from the scope of the invention as defined by the appended claims.

We claim:

1. A method for fabricating a rectifying connection to a body of N-type germanium, comprising:
- applying to said body a layer of a material selected from the class consisting of zinc and cadmium;
- applying to said layer a body of solder consisting essentially of gallium, tin, and a material selected from the group consisting of zinc and cadmium, the mass of said tin exceeding the mass of said material and the mass of said gallium being between about 0.01 and about 0.04 percent by weight of said solder;
- heating said solder in contact with said layer to form a melt of said solder, said material of said layer, and a thin surface portion of said germanium body underlying said layer; and
- subsequently cooling said melt to resolidify it and to form in said germanium body a recrystallized region containing a rectifying junction.

2. A method for fabricating a rectifying connection to a body of N-type germanium and for attaching an electrically-conductive lead member thereto, which comprises:
- applying to a part of said body a layer of a material selected from the group consisting of cadmium and zinc;
- applying to said layer a body of solder consisting essentially of gallium, tin and a material selected from the class consisting of cadmium and zinc, the mass of said tin exceeding the mass of said material and the mass of gallium being between about 0.01 and about 0.04 percent by weight of said solder;
- heating said solder in contact with said layer to form a melt of said solder, said layer and a thin surface stratum of said body of germanium under said layer; and
- subsequently cooling said melt to resolidify it while maintaining said electrically-conductive lead member in contact with said melt.

3. A method for fabricating a rectifying connection to a body of N-type germanium, comprising:
- melting on a portion of said body a mixture consisting essentially of gallium, tin and at least one metal selected from the class consisting of zinc and cadmium to form a melt consisting of said molten mixture and germanium of said portion, the mass of said tin being greater than the mass of said metal and the mass of said gallium being between about 0.01 and about 0.04 percent by weight of said mixture; and
- subsequently cooling said melt to resolidify it, thereby to form a rectifying junction in said body.

4. A method for fabricating a rectifying connection to a body of N-type germanium, comprising:
- applying to said body a layer of a material selected from the class consisting of zinc and cadmium;
- applying to said layer a body of solder consisting essentially of about 90 percent by weight of tin, about 0.01 to about 0.04 percent by weight of gallium and the balance zinc;

heating said solder in contact with said layer to form a melt of said solder, said material of said layer, and a thin surface portion of said germanium body underlying said layer; and subsequently cooling said melt to resolidify it and to form in said germanium body a recrystallized region containing a rectifying junction.

5. A method for fabricating a rectifying connection to a body of N-type germanium and for attaching an electrically-conductive lead member thereto, which comprises:

applying to a part of said body a layer of a material selected from the group consisting of cadmium and zinc;

applying to said layer a body of solder consisting essentially of about 90 percent by weight of tin, about 0.01 to about 0.04 percent by weight of gallium and the balance zinc;

heating said solder in contact with said layer to form a melt of said solder, said layer and a thin surface stratum of said body of germanium under said layer; and subsequently cooling said melt to resolidify it while maintaining said electrically-conductive lead member in contact with said melt.

6. A method according to claim 2, in which said body of solder is applied to said lead member before said formation of said melt and is held against said layer during said heating.

7. A semiconductor device comprising a body of N-type germanium having a mixture consisting essentially of tin, zinc and gallium fused therewith to a depth of less than about 0.001 mil, said fused mixture forming a rectifying connection to said body, the mass of said tin exceeding the mass of said zinc and the mass of said gallium being between about 0.01 and about 0.04 percent by weight of said mixture.

8. A semiconductor device comprising a body of N-type germanium having a mixture consisting essentially of about 90 percent by weight of tin, about 0.01 to about 0.04 percent by weight of gallium and the balance zinc fused therewith to a depth of less than about 0.001 mil, said fused mixture forming a rectifying connection to said body.

9. A solder for forming a rectifying connection in a body of N-type germanium by fusion of said solder with a portion of said body, said solder consisting essentially of tin, zinc and gallium, the mass of said tin exceeding the mass of said zinc and the mass of said gallium being between about 0.01 and about 0.04 percent by weight of said solder.

10. A solder for forming a rectifying connection in a body of N-type germanium by fusion of said solder with a portion of said body, said solder consisting essentially of about 90 percent by weight of tin, about 0.01 to about 0.04 percent by weight of gallium and the balance zinc.

11. As the collector connection of a transistor of the type having an N-type germanium base region: a mixture of cadmium, tin, zinc and gallium fused to said base region to a depth of less than 0.001 ml, said fused mixture forming a rectifying connection to said region, the mass of said tin exceeding the sum of the masses of said zinc and said cadmium and the mass of said gallium being between about 0.01 and about 0.04 percent by weight of said mixture.

References Cited by the Examiner

UNITED STATES PATENTS

| | | | |
|---|---|---|---|
| 2,977,262 | 3/1961 | Carlson | 148—33.6 |
| 3,005,735 | 10/1961 | Schnable | 149—1.5 |
| 3,010,857 | 11/1961 | Nelson | 148—33.6 |

DAVID L. RECK, *Primary Examiner.*

HYLAND BIZOT, *Examiner.*